United States Patent [19]
Taur et al.

[11] Patent Number: 5,646,058
[45] Date of Patent: Jul. 8, 1997

[54] METHOD FOR FABRICATING A SELF-ALIGNED DOUBLE-GATE MOSFET BY SELECTIVE LATERAL EPITAXY

[75] Inventors: Yuan Taur, Bedford; Hon-Sum Philip Wong, Chappagua, both of N.Y.

[73] Assignee: International Business Machines Corporation, Armonk, N.Y.

[21] Appl. No.: 690,152

[22] Filed: Aug. 1, 1996

Related U.S. Application Data

[60] Division of Ser. No. 407,175, Mar. 21, 1995, Pat. No. 5,604,368, which is a continuation-in-part of Ser. No. 276,072, Jul. 15, 1994, abandoned.

[51] Int. Cl.$^6$ ............................................. H01L 21/8234
[52] U.S. Cl. .................. 437/40 R; 437/29; 437/41 GS; 437/89; 437/913
[58] Field of Search .................... 437/40 R, 41 R, 437/40 GS, 41 GS, 41 CS, 89, 29, 34, 56, 57, 58, 59, 913; 148/33.5, DIG. 50

[56] References Cited

U.S. PATENT DOCUMENTS

| | | | |
|---|---|---|---|
| 4,670,768 | 6/1987 | Sunami et al. | 437/41 R |
| 5,120,666 | 6/1992 | Gotou | 437/40 TFT |
| 5,188,973 | 2/1993 | Omura et al. | 437/41 TFT |
| 5,273,921 | 12/1993 | Neudeck et al. | 437/89 |
| 5,340,754 | 8/1994 | Witek et al. | 437/89 |
| 5,461,250 | 10/1995 | Burghartz et al. | 257/347 |
| 5,565,368 | 10/1996 | Tsuji | 437/41 CS |

OTHER PUBLICATIONS

"Ultrafast Low–Power Operation of P+—n+ Double Gate SOI MOSFETs"; Tanaka et al; Apr. 1994 Symp. on VLSI Technology Digest of Technical Papers IEEE; pp. 11–12.

*Primary Examiner*—Michael Trinh
*Attorney, Agent, or Firm*—Robert P. Tassinari, Jr.

[57] ABSTRACT

A novel method of fabricating a double-gate MOSFET structure is disclosed. The method utilizes selective lateral epitaxial growth of silicon into a thin gap formed between two sacrificial dielectric films for accurate thickness control. The sacrificial films are then replaced by a gate material (e.g., polysilicon) such that top and bottom gates are self-aligned to each other and to the channel region. Also disclosed is a self-aligned double-gate MOSFET constructed in accordance with the foregoing method.

4 Claims, 3 Drawing Sheets

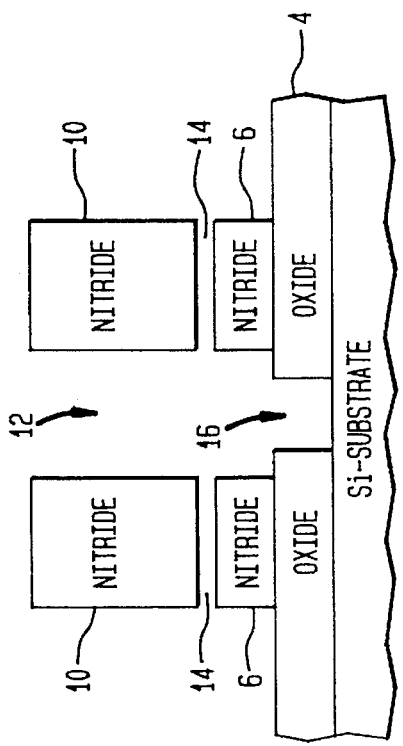
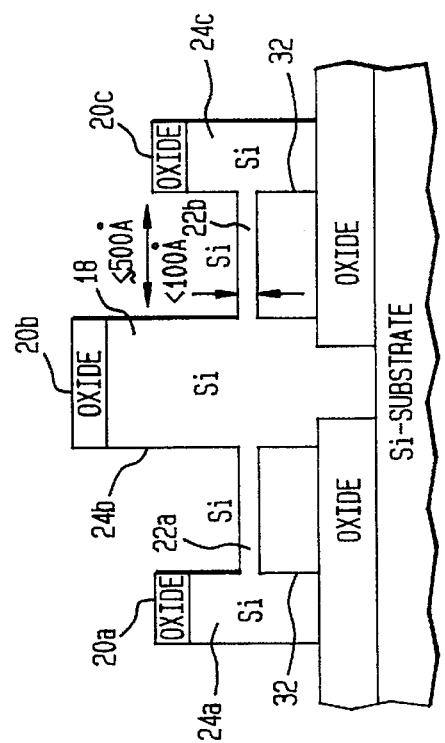
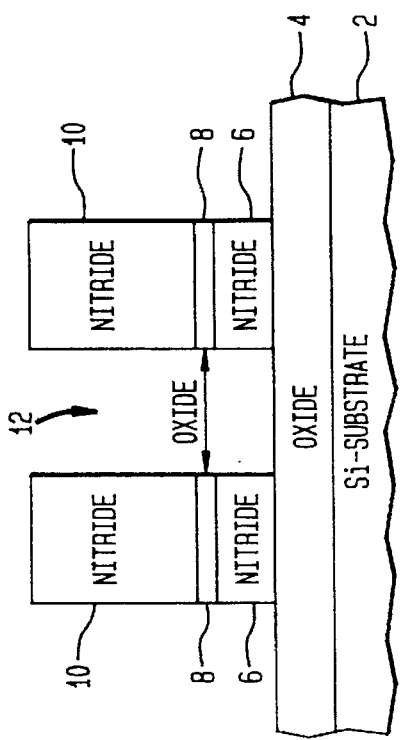
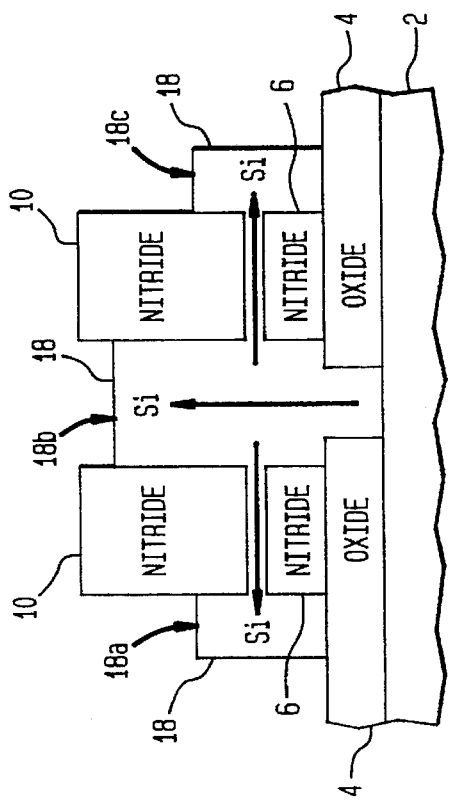

METHOD FOR FABRICATING A SELF-ALIGNED DOUBLE-GATE MOSFET BY SELECTIVE LATERAL EPITAXY

CROSS REFERENCE TO RELATED APPLICATION

This is a division of application Ser. No. 08/407,175 filed Mar. 21, 1995, U.S. Pat. No. 5,604,368 which is a continuation in part of application Ser. No. 08/276,072, filed Jul. 15, 1994, abandoned.

FIELD OF THE INVENTION

The invention relates to the fabrication of MOSFET devices, and in particular to the fabrication of double-gated MOSFET devices.

BACKGROUND OF THE INVENTION

It is well known that a double-gate MOSFET has several advantages over a conventional single-gate MOSFET: higher transconductance, lower parasitic capacitance, and better short-channel effects. Monte-Carlo simulation has been carried out on a 30 nm channel double-gate MOSFET, which shows very high transconductance (2300 mS/mm) and fast switching speed (1.1 ps for nMOSFET). Moreover, good short-channel characteristics are obtained down to 20 nm channel length with no doping needed in the channel region. This circumvents all the tunneling breakdown, dopant quantization, and dopant depletion problems associated with channel doping.

However, there is no satisfactory way of making such a double-gate structure with both top and bottom gates self-aligned to the channel region. Previous efforts on fabricating double-gate MOSFET's generally fall into one of the following three categories:

(a) Etch silicon into a pillar structure and deposit gates around it.

(b) Make a conventional single-gate MOSFET, then use either selective epitaxy or bond-and-etch-back techniques and form the second gate.

(c) Start with a thin SOI film, pattern a strip and dig a tunnel across it by etching the buried oxide. Then deposit gate electrodes in the tunnel and on top of the SOI film.

There are serious drawbacks in all of the above approaches. For example, in (a), it is difficult to form a vertical pillar as thin as 10 nm with good thickness control and free of RIE damage. In (b), it is difficult to keep the top and bottom gate oxides at the same thickness and to have the gates self-aligned to each other. And again, in (c), thickness control and top/bottom gate self-alignment are major problems.

Thus, it can be seen that a need has arisen for a method of fabricating a double-gated MOSFET which avoids the foregoing shortcomings of the prior art.

SUMMARY OF THE INVENTION

The present invention solves the foregoing problems with the prior art by providing a double-gate MOSFET, and method for fabricating the same.

The double-gate MOSFET includes a semiconductor substrate having a silicon dioxide layer on its upper surface, the silicon dioxide layer having an opening therein, and an epitaxial semiconductor structure formed from the opening. The semiconductor structure has a channel region of a first length, depth, and width between a drain region and source region, the channel region having first and second oxide layers on first and second juxtaposed major surfaces. The channel region has top and bottom gate electrodes formed on the first and second oxide layers, wherein the top and bottom gate electrodes are self-aligned to each other and to the channel region.

The method for fabricating the double-gate MOSFET in accordance with the invention includes providing a silicon substrate, forming an oxide layer on the silicon substrate, forming a sacrificial dielectric film on the oxide layer, forming a spacer film on the sacrificial dielectric film, and forming a sacrificial dielectric layer on the spacer film. The sacrificial dielectric layer, the spacer film and the sacrificial dielectric film are patterned to form a channel therein. The spacer film is etched to form a gap between the sacrificial dielectric layer and the sacrificial dielectric film. A slot is etched in the oxide layer to expose the silicon substrate, and epitaxial silicon is grown in the slot, the channel and the gap, such that the silicon emerges from the gap at its ends. The exposed regions of the epitaxial silicon are doped and oxidized, and the sacrificial dielectric film and the sacrificial dielectric layer are stripped away. Next, grow gate oxide on the exposed regions of the epitaxial silicon. Polysilicon is deposited to form a top gate in the region formerly occupied by the sacrificial dielectric layer, and a bottom gate in the region formerly occupied by the sacrificial dielectric film.

FIGURES

FIGS. 1(a)–1(e) shows a preferred processing sequence for fabricating a double-gate MOSFET in accordance with the present invention.

DETAILED DESCRIPTION OF THE PREFERRED EMBODIMENT

Figure 1E:
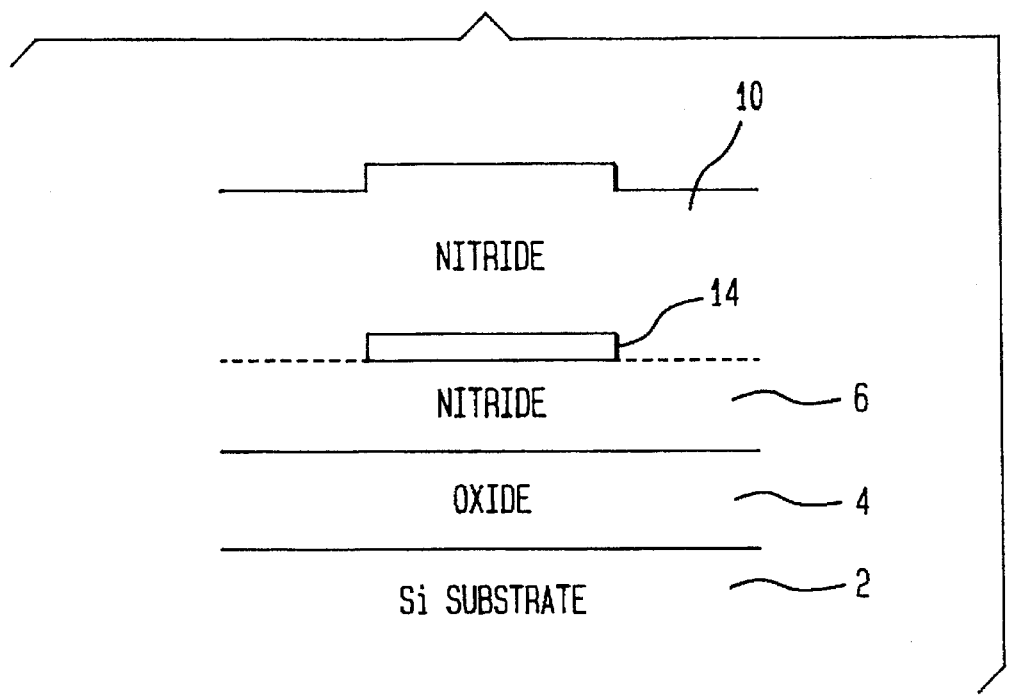

The invention is a novel method of fabricating a double-gate MOSFET structure. The method utilizes selective lateral epitaxial growth of silicon into a thin gap formed between two sacrificial dielectric (e.g., nitride) films for accurate thickness control. The sacrificial dielectric films are then replaced by a gate material (e.g., polysilicon) such that top and bottom gates are self-aligned to each other and to the channel region.

A schematic process flow is shown in FIGS. 1(a)–(e). Two double-gate MOSFET's are formed side by side in these figures.

The process described in FIGS. 1(a)–(e) is as follows:

Start with an ordinary bulk silicon substrate 2. Grow a layer of thick silicon dioxide 4. In a preferred embodiment, the silicon dioxide layer is grown to a thickness of about 200 nm by thermal oxidation or CVD.

Deposit a sacrificial dielectric film 6 by CVD of a thickness of about 100 nm, a thin spacer (e.g., silicon dioxide) film 8 (2–100 nm) and pattern, by conventional lithography, the spacer film 8. This produces a gap 14 which will define the dimensions of a channel region to be produced in a subsequent step to define the channel width dimension of the channel 14.

Deposit another layer of sacrificial dielectric film 10. Pattern, by photolithography, the top sacrificial film 10, spacer film 8, and the bottom sacrificial film 6 together to define the channel length dimension to provide mechanical support of the top sacrificial film in the channel width dimension, as shown in FIG. 1(a). Etch using RIE.

Wet etch away the spacer film 8 between the sacrificial films 6 and 10, using, e.g., HF, to leave a uniform gap 14 with a thickness controlled by the thickness of the spacer film 8 (2–100 nm). Top sacrificial film 10 is supported in the third dimension as shown in the side view in FIG. 1(e).

Pattern by photolithography and etch by RIE a slot 16 through the thick silicon dioxide 4 to expose the silicon substrate 2 between the sacrificial film stacks as shown in FIG. 1(b).

Grow selective epitaxial silicon 18 vertically out of the slot 16 in the thick oxide 4, between the sacrificial film stacks, and laterally through the gap 14 between the sacrificial films 6 and 10.

The reactant gas for the selective epitaxial growth (e.g., $SiCl_2H_2$) is supplied through the open end of the gap.

Continue epitaxial growth until some amount of silicon 18 emerges from the other side of the gaps, as shown in FIG. 1(c).

Dope all three exposed silicon regions 18a, 18b and 18c with source-drain dopants (e.g., arsenic for n-channel; boron for p-channel) by either implant (preferred) or diffusion. In order to dope the bottom part of these regions uniformly, some doping can be performed while the epitaxial silicon is being grown.

Thermally oxidize the exposed silicon regions 18a, 18b, and 18c and wet strip both sacrificial films using hot phosphoric acid to produce the structure of FIG. 1(d). After stripping, the exposed silicon regions will have oxide layers 20a, 20b and 20c thereon, which are several hundred Angstroms thick. This will keep the overlap capacitance low.

The structure is again thermally oxidized to form thin gate oxide layers on surfaces 22d, 22e, 22f and 22g. Because these gate oxide layers are thermally grown simultaneously, and therefore for an equal duration, uniform gate oxide thicknesses can be achieved for the two gates in the dual gate device. Uniformity allows more effective control of the channel region. Further, because this oxide is thermally grown on the single crystal silicon (22a and 22b) constituting the channel region, this gate oxide can be grown much thinner (without defects) than oxide grown on polysilicon gate material. The thin gate oxide, therefore, allows the dual gate MOSFET of the present invention to be scaled to much smaller sizes then has yet been possible. The thin oxides which can be much less than 100 Å, are shown as layers 122 in FIG. 2. Preferably the oxide layers will be 50 Å or less.

Figure 2:
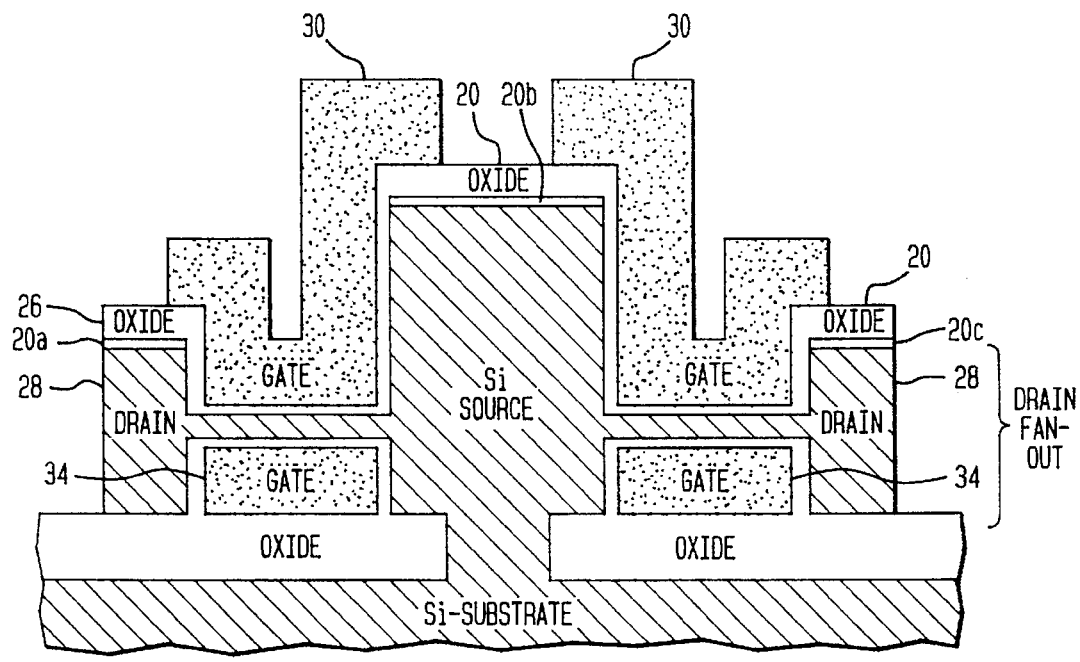
FIG. 2 is a cross-sectional view of a self-aligned double-gate MOSFET fabricated in accordance with the processing sequence of FIGS. 1(a)–1(e).

Finally, referring to FIG. 2, gate material (e.g., polysilicon) is deposited and patterned as shown to form top gate 30 and bottom gate 34. A highly conformal CVD deposition is required here to refill the tunnel space (32 in FIG. 1(d)) left by the sacrificial films, and form the bottom gate electrode 34 self-aligned to the channel and the top gate. If necessary, alternate CVD and RIE steps can be employed to avoid sealing of the tunnel openings before the tunnel is filled by the gate material.

Figure 3:
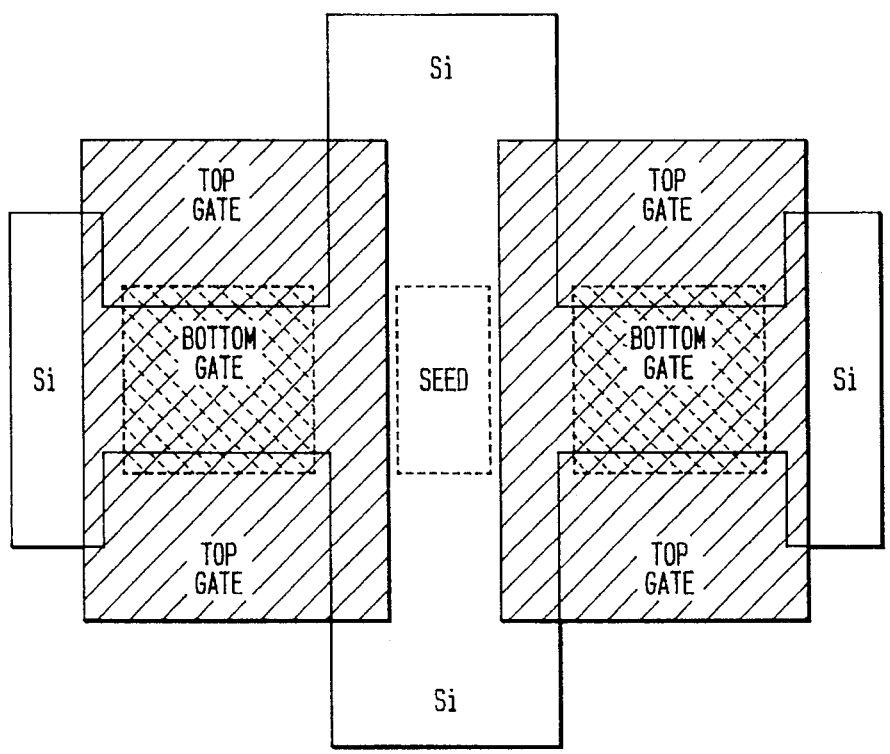
FIG. 3 is a top view of the MOSFET of FIG. 2.

The top view of the self-aligned double-gate MOSFET is shown in FIG. 3. The channel length (as shown in FIG. 3) is determined by the initial sacrificial film line width which can easily be $\leq 50$ nm using e-beam lithography.

The source-drain regions fan out in both dimensions from the end of the channel, as shown in FIG. 2, which is the preferred configuration for low series resistance. That is, with the fanned-out configuration, less parasitic resistance is presented to the current leaving the channel region. Less parasitic resistance results in faster device speed (higher rate of current flow).

The self-aligned double-gate MOSFET devices fabricated in accordance with the invention are useful for high performance, as well as high density, low power logic application. This technology allows continued scaling of CMOS technology beyond its perceived limits. Furthermore, an important feature of the present invention is that the double-gate MOSFET does not require an SOI substrate, making it suitable for low-cost products, while still maintaining the same low Soft-Error-Rate as SOI devices.

While the invention has been described in terms of preferred embodiments thereof, it should be understood that departures from the disclosed embodiments can readily be made without departing from the spirit and scope of the invention.

Having thus described our invention, what we claim as new, and desire to secure by Letters Patent is:

1. A method for fabricating a double-gate MOSFET, comprising the steps of:

provide a silicon substrate;

forming an oxide layer on the silicon substrate;

forming a sacrificial dielectric film on the oxide layer;

forming a spacer film on the sacrificial dielectric film;

forming a sacrificial dielectric layer on the spacer film;

patterning the sacrificial dielectric layer, the spacer film and the sacrificial dielectric film to form a channel therein;

etching the spacer film to form a gap between the sacrificial dielectric layer and the sacrificial dielectric film;

etching a slot in the oxide layer to expose the silicon substrate;

growing epitaxial silicon in the slot, the channel and the gap, such that the silicon emerges from the gap at its ends;

doping exposed regions of the epitaxial silicon;

oxidizing the exposed silicon regions;

stripping the patterned sacrificial dielectric film and the patterned sacrificial dielectric layer;

forming oxide layers of about 100 Å or less on the epitaxial silicon in the regions from which the sacrificial dielectric film was removed;

depositing polysilicon to form a top gate in the region formerly occupied by the patterned sacrificial dielectric layer, and a bottom gate in the region formerly occupied by the patterned sacrificial dielectric film.

2. The method of claim 1, wherein the sacrificial dielectric film is a nitride film.

3. The method of claim 1, wherein the sacrificial dielectric layer is a nitride layer.

4. The method of claim 1, wherein the spacer film is an oxide film.

* * * * *